(12) United States Patent
Kim et al.

(10) Patent No.: US 6,413,321 B1
(45) Date of Patent: Jul. 2, 2002

(54) METHOD AND APPARATUS FOR REDUCING PARTICLE CONTAMINATION ON WAFER BACKSIDE DURING CVD PROCESS

(75) Inventors: Bok Hoen Kim, San Jose; Mario Dave Silvetti, Morgan Hill; Ameeta Madhava, San Francisco; Davood Khalili, Santa Clara; Martin Seamons, San Jose; Emanuele Cappello, Saratoga; Nam Le, San Jose; Lloyd Berken, Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/731,601

(22) Filed: Dec. 7, 2000

(51) Int. Cl.⁷ .................. C23C 16/00; H01L 21/31; H01L 21/469
(52) U.S. Cl. ............... 118/725; 118/719; 438/680; 438/758; 438/765
(58) Field of Search .............. 118/719, 725; 438/708, 680, 758, 765

(56) References Cited

U.S. PATENT DOCUMENTS

| | | | |
|---|---|---|---|
| 3,627,590 A | 12/1971 | Mammel | 148/1.5 |
| 4,798,165 A | 1/1989 | deBoer et al. | 118/715 |
| 5,045,346 A | 9/1991 | Tabasky et al. | 427/39 |
| 5,221,414 A | 6/1993 | Langley et al. | 156/626 |
| 5,230,741 A | 7/1993 | van de Ven et al. | 118/728 |
| 5,238,499 A * | 8/1993 | van de Ven et al. | 118/724 |
| 5,244,730 A | 9/1993 | Nguyen et al. | 428/336 |
| 5,350,427 A * | 9/1994 | Freytsis et al. | 29/25.01 |
| 5,366,585 A | 11/1994 | Robertson et al. | 156/643 |
| 5,374,594 A | 12/1994 | van de Ven et al. | 437/247 |
| 5,447,570 A | 9/1995 | Schmitz et al. | 118/728 |
| 5,589,233 A | 12/1996 | Law et al. | 427/579 |
| 5,614,055 A | 3/1997 | Fairbairn et al. | 156/345 |
| 5,855,681 A | 1/1999 | Maydan et al. | 118/719 |
| 5,871,811 A | 2/1999 | Wang et al. | 427/248.1 |
| 5,879,128 A * | 3/1999 | Tietz et al. | 414/717 |
| 6,020,035 A | 2/2000 | Gupta et al. | 427/534 |

OTHER PUBLICATIONS

U.S. application No. 08/872,722, Rossman et al.
U.S. application No. 08/234,746, Nowak et al.

* cited by examiner

Primary Examiner—Alexander G. Ghyka
(74) Attorney, Agent, or Firm—Townsend & Townsend & Crew

(57) ABSTRACT

Backside particle contamination of semiconductor wafers subjected to chemical vapor deposition is significantly reduced by optimizing various process parameters, alone or in combination. A high quality oxide seasoning layer is deposited to improve adhesion and trapping of contaminants remaining after a prior chamber cleaning step. Second, wafer pre-heating reduces thermal stress on the wafer during physical contact between the wafer and heater. Third, the duration of the gas stabilization flow of thermally reactive process gas species prior to CVD reaction is reduced, thereby preventing side products produced during this stabilization flow from affecting the wafer backside. Fourth, the wafer heater is redesigned to minimize physical contact between the heater surface and the wafer backside. Redesign of the wafer heater may include providing only a few, small projections from the top wafer surface, and also may include providing a continuous circumferential rim supporting the edge of the wafer to interfere with the flow of process gases to the wafer backside during processing.

6 Claims, 12 Drawing Sheets

METHOD AND APPARATUS FOR REDUCING PARTICLE CONTAMINATION ON WAFER BACKSIDE DURING CVD PROCESS

BACKGROUND OF THE INVENTION

The present invention relates to the fabrication of integrated circuits. More particularly, embodiments of the invention include methods and apparatuses for improving the quality of films deposited in a substrate processing chamber by reducing the number of particles formed on the backside of a wafer.

The geometry of semiconductor devices has decreased dramatically in size since such devices were first introduced several decades ago. Integrated circuits have generally followed the two year/half-size rule (often called "Moore's Law") which states that the number of devices fitting on a chip will double every two years. Today's wafer fabrication plants are routinely producing integrated circuits having 0.5 and even 0.35 micron feature sizes, and tomorrow's plants soon will be producing devices having even smaller geometries.

During chemical vapor deposition (CVD) of material layers making up these semiconductor devices, improved control over criteria such as particle generation and contamination is necessary to ensure that deposited layers meet the stringent specifications of manufacturers. In order to meet processing demands created by such small scale geometry devices, new technology for substrate processing equipment is constantly being developed.

For example, as device sizes become smaller and integration density increases, issues not previously considered important are emerging as areas of concern. One such issue is backside wafer contamination.

Particle contamination on the backside of wafers has become a serious issue in advanced microelectronics manufacturing for several reasons. One reason is that particles on the backside of the wafer can cause cross contamination and electrical contact failures in interconnect structures.

A second reason for the importance of wafer backside particle contamination is change in wafer planarity associated with such contamination. Specifically, particles present on the backside of the wafer can impact control over the critical dimension (CD) in lithographic processes by causing wafer warpage. The depth of focus in sub-half micron lithography is approximately ±0.5 $\mu$m, and factors such as field image curvature, circuit topography, wafer flatness and auto-focus errors reduce the usable focus margin. Therefore, ensuring the planarity of wafers during the lithographic process becomes more critical in obtaining tight CD control.

Anti reflective coatings (ARC) formed by plasma-enhanced chemical vapor deposition (PECVD) have been widely used to control CD during photolithography processing steps by suppressing over 99% of light reflected from a substrate. In general however, wafers that have received an ARC film must generally be subjected to additional processing steps in order to remove particles on the wafer backside before the wafer is exposed to lithography steps.

One such additional processing step is wafer backside scrubbing, but this technique cannot completely remove defects on the backside of wafers when such defects are the result of chemical reaction involving deposited material. Some residual defects still remain on wafers even after the back side scrubbing due to inherent limitations in wet chemical etching.

Therefore, there is a need in the art for methods and apparatuses which reduce particle contamination on the wafer backside during CVD processes.

SUMMARY OF THE INVENTION

One embodiment of the present invention provides methods and apparatuses of reducing the number of particles and other contaminants formed on the backside of wafers during semiconductor processing. Specifically, a number of techniques may be utilized, alone or in combination, to reduce the level of backside particulate contamination.

First, following a periodic chamber cleaning step, an oxide seasoning reaction is performed to coat interior chamber surfaces and the wafer heater with an oxide coating. Second, wafers entering the CVD chamber are preheated before being placed into direct physical contact with the wafer heater structure, thereby reducing thermal stress imposed on the wafer. Third, the flow time of deposition process gases during pre-deposition stabilization steps are kept to a minimum, thereby reducing decomposition of deposition process gases and contamination between the heater surface and the wafer back side. Fourth, a minimum contact wafer heater structure is employed to support and heat the wafer during processing. This heater structure contacts as small an area of the back side of the wafer as possible, and also restricts the flow of process gases against the wafer back side. Each of these techniques is discussed in detail below.

A wafer heater apparatus in accordance with one embodiment of the present invention comprises a pedestal including a heated circular top surface, and a plurality of projections extending upward from the circular top surface. An elevated rim is positioned around a circumference of the top surface.

An embodiment of a method for depositing material on a semiconductor wafer comprises providing a substantially circular semiconductor wafer having a front side and a back side, and providing a wafer heater at a first temperature, the wafer heater including a top surface featuring a plurality of projections and an elevated circumferential rim. The back side of the semiconductor wafer is placed into contact with the heater, such that an edge of the wafer is supported by the rim. The rim interferes with the flow of process gases from the front side of the wafer to the back side of the wafer.

A further understanding of the objects and advantages of the present invention can be made by way of reference to the ensuing detailed description taken in conjunction with the accompanying drawings.

DESCRIPTION OF THE SPECIFIC EMBODIMENTS

Back side wafer particle contamination during CVD is reduced by carefully controlling a number of process parameters, alone or in combination. First, following a periodic chamber cleaning step, an oxide seasoning reaction is performed to coat interior chamber surfaces and the wafer heater with a high quality oxide material. Second, wafers entering the CVD chamber are preheated before being placed into direct physical contact with the wafer heater structure, thereby reducing thermal stress on the wafers. Third, flow time of deposition process gases during pre-deposition stabilization steps is kept to a minimum, thereby reducing decomposition of deposition process gases and contamination between the heater surface and the wafer back side. Fourth, a minimum contact wafer heater structure is employed to support and heat the wafer during processing. This heater structure contacts as small an area of the wafer back side as possible, and restricts flow of process gases against the wafer back side. Each of these techniques is discussed in detail below.

I. Exemplary Substrate Processing Chamber

FIGS. 1A–1D illustrate the Applied Materials Producer™ wafer processing system. This system is described in detail in U.S. Pat. No. 5,855,681, incorporated herein by reference.

Figure 1A:
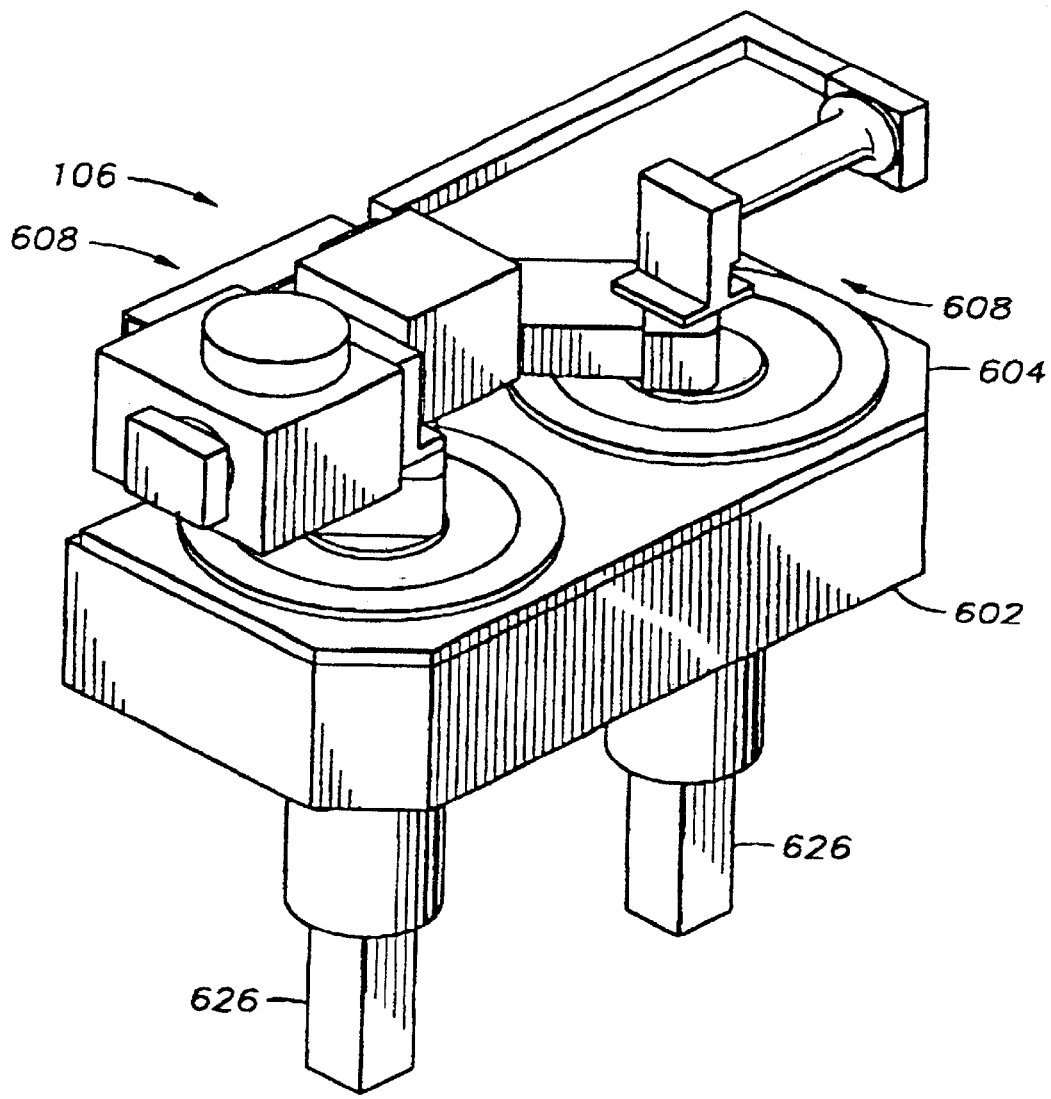
FIG. 1A is a perspective view of one embodiment of a processing chamber of the present invention.

FIG. 1A shows a perspective view of one embodiment of a tandem processing chamber 106 of the present invention. Chamber body 602 is mounted or otherwise connected to the transfer chamber 104 and includes two processing regions in which individual wafers are concurrently processed. The chamber body 602 supports a lid 604 which is hindgedly attached to the chamber body 602 and includes one or more gas distribution systems 608 disposed therethrough for delivering reactant and cleaning gases into multiple processing regions.

Figure 1B:
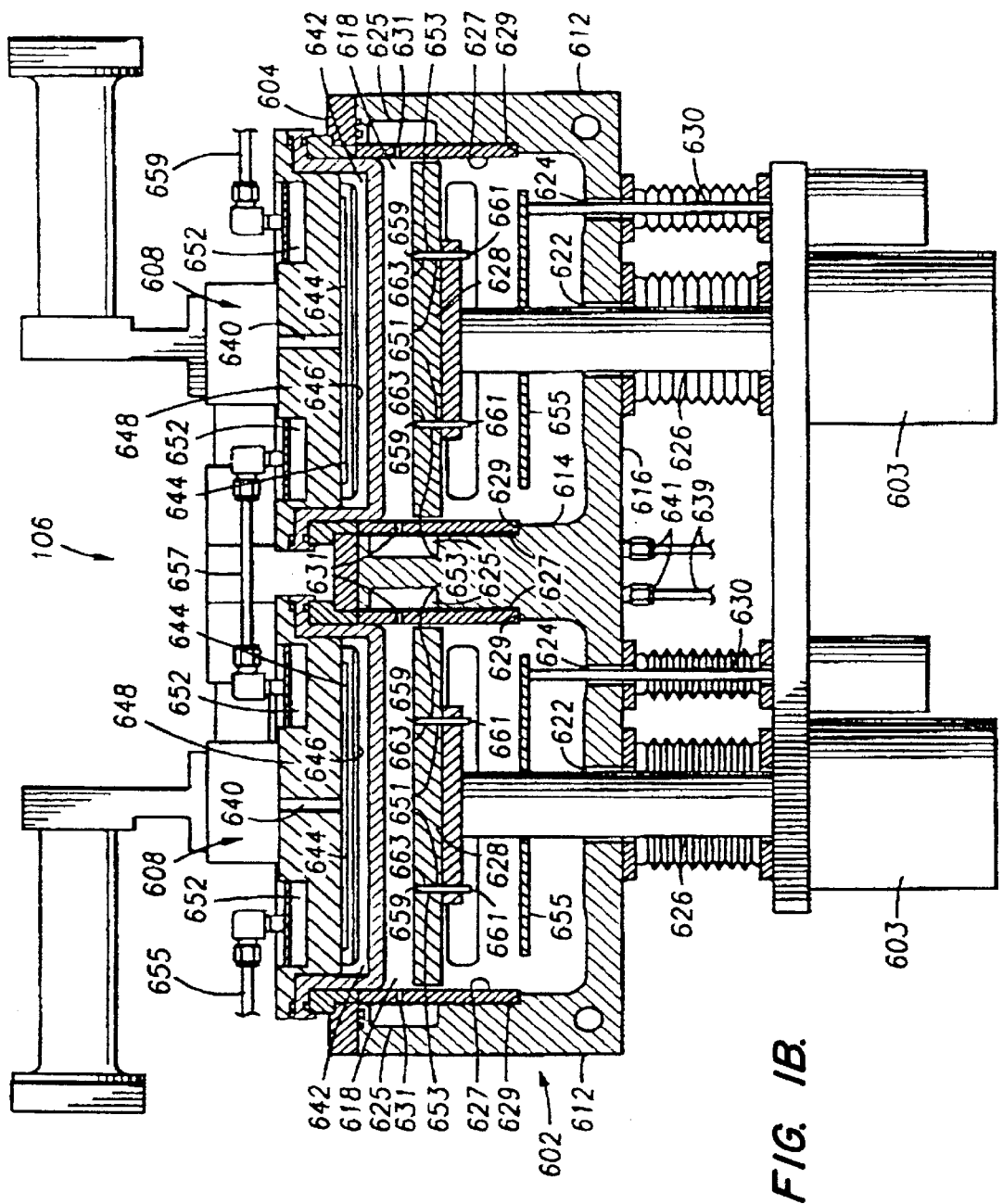
FIG. 1B is a cross sectional view of one embodiment of a processing chamber of the present invention.

FIG. 1B shows a schematic cross-sectional view of the chamber 106 defining two processing regions 618, 620. Chamber body 602 includes sidewall 612, interior wall 614 and bottom wall 616 which define the two processing regions 618, 620. The bottom wall 616 in each processing region 618, 620 defines at least two passages 622, 624 through which a stem 626 of a pedestal heater 628 and a rod 630 of a wafer lift pin assembly are disposed, respectively. A pedestal lift assembly and the wafer lift will be described in detail below.

The sidewall 612 and the interior wall 614 define two cylindrical annular processing regions 618, 620. A circumferential pumping channel 625 is formed in the chamber walls defining the cylindrical processing regions 618, 620 for exhausting gases from the processing regions 618, 620 and controlling the pressure within each region 618, 620. A chamber liner or insert 627, preferably made of ceramic or the like, is disposed in each processing region 618, 620 to define the lateral boundary of each processing region and to protect the chamber walls 612, 614 from the corrosive processing environment and to maintain an electrically isolated plasma environment between the electrodes. The liner 627 is supported in the chamber on a ledge 629 formed in the walls 612, 614 of each processing region 618, 620. The liner includes a plurality of exhaust ports 631, or circumferential slots, disposed therethrough and in communication with the pumping channel 625 formed in the chamber walls. Preferably, there are about twenty four ports 631 disposed through each liner 627 which are spaced apart by about 15° and located about the periphery of the processing regions 618, 620. While twenty four ports are preferred, any number can be employed to achieve the desired pumping rate and uniformity. In addition to the number of ports, the height of the ports relative to the face plate of the gas distribution system is controlled to provide an optimal gas flow pattern over the wafer during processing.

Figure 1C:
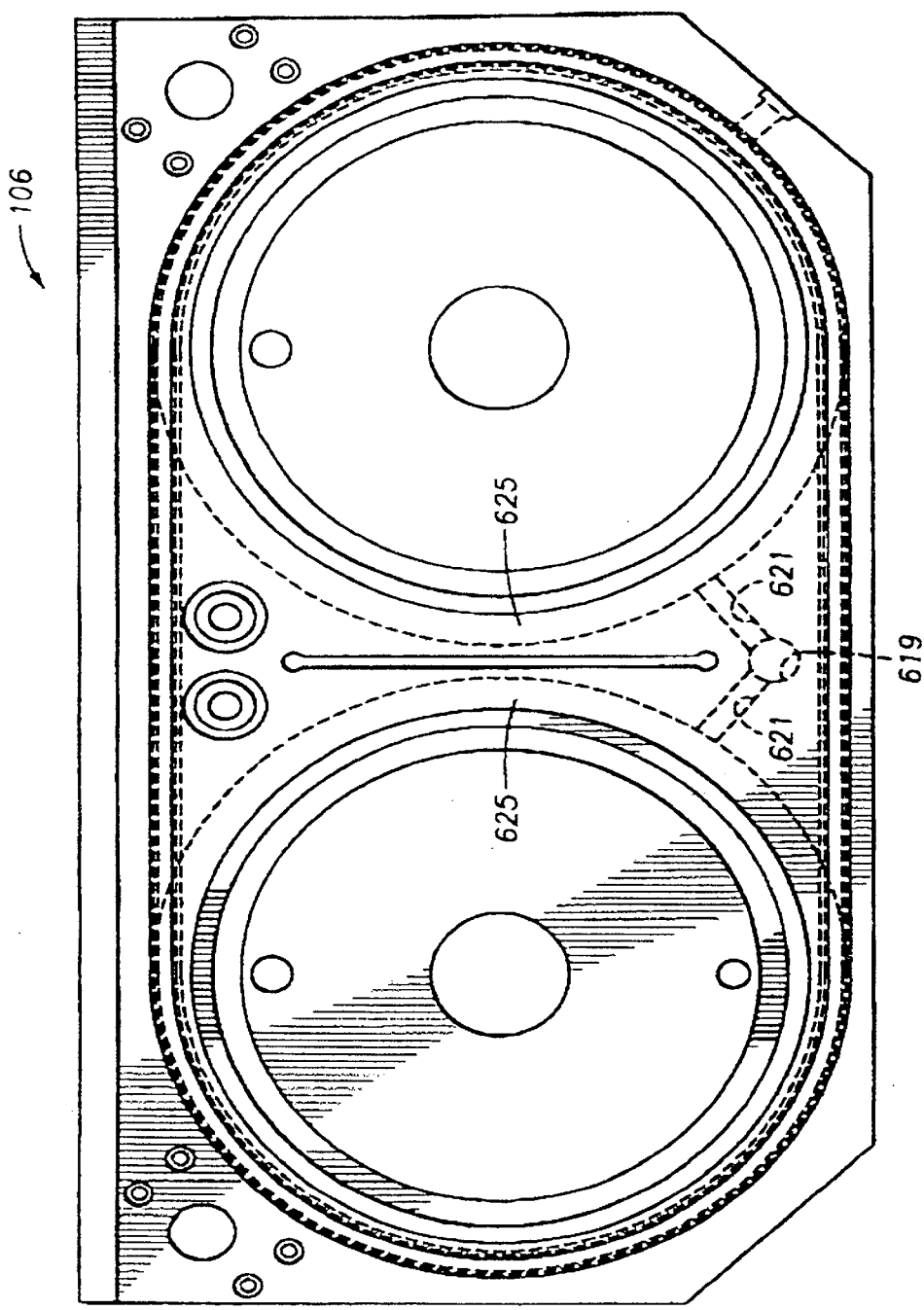
FIG. 1C is a top view of a processing chamber of the present invention with the lid removed.

FIG. 1C shows a cross sectional view of the chamber illustrating the exhaust system of the present invention. The pumping channels 625 of each processing region 618, 620 are preferably connected to a common exhaust pump via a common exhaust channel 619. The exhaust channel 619 is connected to the pumping channel 625 of each region 618, 620 by exhaust conduits 621. The exhaust channel 619 is connected to an exhaust pump via an exhaust line (not shown). Each region is preferably pumped down to a selected pressure by the pump and the connected exhaust system allows equalization of the pressure within each region.

Referring back to FIG. 1B, each of the processing regions 618, 620 also preferably include a gas distribution assembly 608 disposed through the chamber lid 604 to deliver gases into the processing regions 618, 620, preferably from the same gas source. The gas distribution system 608 of each processing region includes a gas inlet passage 640 which delivers gas into a shower head assembly 642. The shower head assembly 642 is comprised of an annular base plate 648 having a blocker plate 644 disposed intermediate a face plate 646. An RF feedthrough provides a bias potential to the showerhead assembly to facilitate generation of a plasma between the face plate 646 of the showerhead assembly and the heater pedestal 628. A cooling channel 652 is formed in a base plate 648 of each gas distribution system 608 to cool the plate during operation. An inlet 655 delivers a coolant fluid, such as water or the like, into the channels 652 which are connected to each other by coolant line 657. The cooling fluid exits the channel through a coolant outlet 659. Alternatively, the cooling fluid is circulated through the manifold.

Figure 1D:
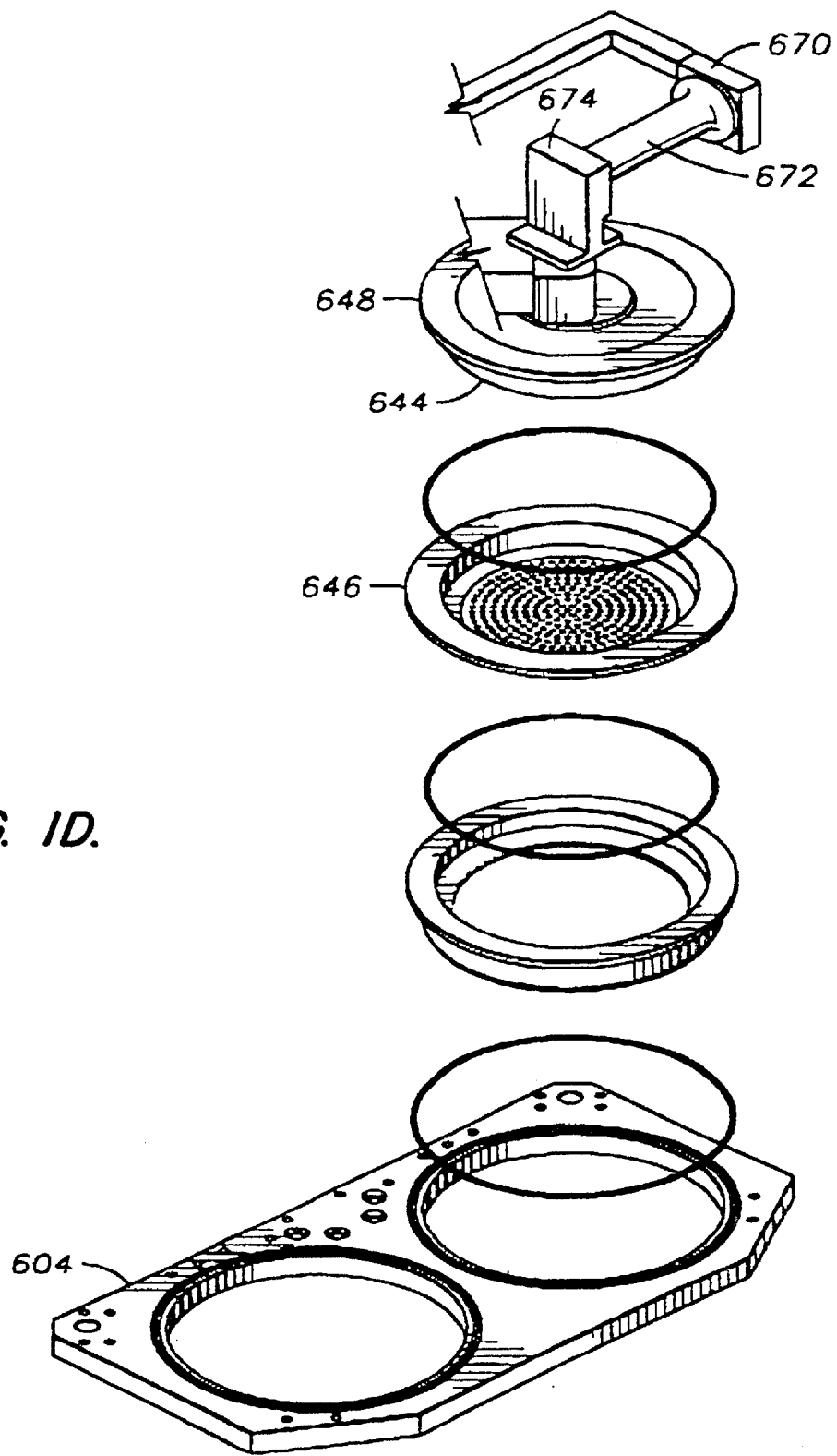
FIG. 1D is an exploded view of the gas distribution assembly.

The chamber body 602 defines a plurality of vertical gas passages for each reactant gas and cleaning gas suitable for the selected process to be delivered in the chamber through the gas distribution system. Gas inlet connections 641 are disposed at the bottom of the chamber 106 to connect the gas passages formed in the chamber wall to the gas inlet lines 639. An o-ring is provided around each gas passage formed through the chamber wall on the upper surface of the chamber wall to provide sealing connection with the lid as shown in FIG. 1C. The lid includes matching passages to deliver the gas from the lower portion of the chamber wall into a gas inlet manifold 670 positioned on top of the chamber lid as shown in FIG. 1D. The reactant gases are delivered through a voltage gradient feed-through 672 and into a gas outlet manifold 674 which is connected to a gas distribution assembly.

The gas input manifold 670 channels process gases from the chamber gas feedthroughs into the constant voltage gradient gas feedthroughs, which are grounded. Gas feed tubes (not shown) deliver or route the process gases through the voltage gradient gas feedthroughs 672 and into the outlet manifold 674. Resistive sleeves surround the gas feed tubes to cause a linear voltage drop across the feedthrough preventing a plasma in the chamber from moving up the gas feed tubes. The gas feed tubes are preferably made of quartz and the sleeves are preferably made of a composite ceramic. The gas feed tubes are disposed within an isolating block which contains coolant channels to control temperature and prevent heat radiation and also to prevent liquefaction of process gases. Preferably, the insulating block is made of Delrin. The quartz feed tubes deliver gas into a gas output manifold 674 which channels the process gases to the blocker plate 644 and into the gas distribution plate 646.

The gas input manifold 670 (see FIG. 1D) also defines a passage which delivers cleaning gases from a chamber gas feedthrough into the remote plasma source. These gases bypass the voltage gradient feedthroughs and are fed into a remote plasma source where the gases are activated into various excited species. The excited species are then delivered to the gas distribution plate at a point just below the blocker plate through a conduit disposed in gas inlet passage 640. The remote plasma source and delivery of reactant cleaning gases will be described in detail below.

The gas lines 639 which provide gas into the gas distribution systems of each processing region are preferably connected to a single gas source line and are therefore shared or commonly controlled for delivery of gas to each processing region 618, 620. The gas line(s) feeding the process gases to the multi-zone chamber are split to feed the multiple process regions by a t-type coupling. To facilitate flow into the individual lines feeding each process region, a filter, such as a sintered nickel filter available from PALL or Millipore, is disposed in the gas line upstream from the splitter. The filter enhances the even distribution and flow of gases into the separate gas feed lines.

The gas distribution system comprises a base plate having a blocker plate disposed adjacent to its lower surface. A face plate is disposed below the blocker plate to deliver the gases into the processing regions. In one embodiment, the base plate defines a gas passage therethrough to deliver process gases to a region just above the blocker plate. The blocker plate disperses the process gases over its upper surface and delivers the gases above the face plate. The holes in the blocker plate can be sized and positioned to enhance mixing of the process gases and distribution over the face plate. The gases delivered to the face plate are then delivered into the processing regions in a uniform manner over a wafer positioned for processing.

A gas feed tube is positioned in the gas passage and is connected at one end to an output line from a remote plasma source. One end of the gas feed tube extends through the gas outlet manifold to deliver gases from the remote plasma source. The other end of the gas feed tube is disposed through the blocker plate to deliver gases beyond the blocker plate to the region just above the face plate. The face plate disperses the gases delivered through the gas feed tube and then delivers the gases into the processing regions.

While this is a preferred gas distribution system, the gases from the remote plasma source can be introduced into the processing regions through a port provided through the chamber wall. In addition, process gases could be delivered through any gas distribution system which is presently available, such as the gas distribution system available from Applied Materials, Inc. of Santa Clara, Calif.

FIG. 1B shows a heater pedestal 628 which is movably disposed in each processing region 618, 620 by a stem 626 which is connected to the underside of a support plate and extends through the bottom of the chamber body 602 where it is connected to a drive system 603. The stem 626 is preferably a circular, tubular, aluminum member, having an upper end disposed in supporting contact with the underside of the heater pedestal 628 and a lower end closed off with a cover plate. The lower end of the stem is received in a cup shaped sleeve, which forms the connection of the stem to the drive system. The stem 626 mechanically positions the heater pedestal 628 within the processing region and also forms an ambient passageway through which a plurality of heater plate connections can extend. Each heater pedestal 628 may include heating elements to heat a wafer positioned thereon to a desired process temperature. The heating elements may include for example a resistive heating element. Alternatively, the heater pedestal may be heated by an outside heating element such as a lamp. A pedestal used to advantage in the present invention is available from Applied Materials, Inc., of Santa Clara, Calif. The pedestal may also support an electrostatic chuck, a vacuum chuck or other chucking device to secure a wafer thereon during processing.

The drive system includes linear electric actuators made by Industrial Device Corporation located in Novato, Calif. The heater assembly is raised and lowered by moving the transfer housing up or down to a process, clean, lift and release position. The transfer housing is connected to the actuator on one side and a linear slide on the other through a carriage plate. The connection between the actuator and the carriage is made via a flexible (ball and socket) joint to allow for any misalignment. The linear slide and carriage plate are biased against one another to prevent rotation and bending thereof. A bellows surrounds the stem of the heater and connects to the chamber bottom on one end and to the transfer housing on the other end. A seal ring is provided in a groove in the stem to seal the outer surface of the lower end of the stem in the sleeve. Leveling of the heater with respect to the faceplate is achieved with the use of three screws.

Alternatively, the drive system 603 includes a motor and reduction gearing assembly suspended below the chamber 106 and connected to a drive belt to a conformable coupling and lead screw assembly. A transfer housing is received on the lead screw assembly, which is guided up and down and held against rotation by a linear slide. The heater lift mechanism is held against the chamber with the drive collar. The heater assembly is raised and lowered by a lead screw which is driven by a stepper motor. The stepper motor is mounted to the heater lift assembly by a motor bracket. The stepper motor drives the lead screw in a bellows. The bellows turn the lead screw to raise or lower the heater assembly to the process, lift and release positions. A seal ring is provided in a groove in the stem to seal the outer surface of the lower end of the stem in the sleeve.

II. Reduction of Wafer Backside Contamination

Careful control over certain processing parameters and conditions of deposition can significantly reduce backside contamination of wafers. In some embodiments of the present invention, utilizing a combination of processing parameters during chemical vapor deposition upon 300 mm wafers resulted in back side contamination of less than 100 adders.

A. Chamber Seasoning

During chemical vapor deposition, deposition gases released into the processing chamber may cause unwanted deposition on areas such as the walls of the processing chamber. Unless removed, this unwanted deposition is a source of particles that may interfere with subsequent processing and adversely affect wafer yield.

To avoid such problems, the inside surface of the deposition chamber is regularly cleaned to remove the unwanted deposition material. This procedure is generally performed as a standard chamber dry clean operation, where an etchant gas, such as nitrogen trifluoride ($NF_3$) is used to etch the deposited material from the chamber walls and other areas. During this dry clean operation, the chamber interior is exposed to etchant gas so that the etchant gas reacts with and removes the deposited material from the chamber walls. Such cleaning procedures are commonly performed between deposition for a predetermined number of wafers.

However, the clean step can itself be a source of particle accumulation. Fluorine from the cleaning plasma can be absorbed and/or trapped in the chamber walls and in other chamber areas that include ceramic lining or other insulation material. The trapped fluorine can be released during subsequent processing steps (e.g., by reacting with constituents from the plasma in a high density plasma CVD (HDP-CVD) step and this fluorine can be absorbed in subsequently deposited silicon oxide or other layers.

To prevent such fluorine absorption and to provide protection against other contaminants within the chamber walls, e.g., the diffusion of metal fluorides, a CVD chamber may be "seasoned" after the dry clean operation. Such seasoning includes depositing a thin layer of material over the chamber walls before a substrate is introduced into the chamber for processing.

The deposited seasoning layer covers the chamber walls, reducing the likelihood that contaminants will interfere with subsequent processing steps. After deposition of the seasoning layer is complete, the chamber is used to deposit material on the predetermined number of wafers and reseasoned. This seasoning gas causes a coating to form over exposed surfaces of the wafer heater. This seasoning coating is intended to lock in place particulate contamination remaining following the prior cleaning step.

The properties of the deposited seasoning material directly impact the particle control on the backside of wafers. Conventionally, the seasoning coating is produced by the flow of nitrogen in combination with oxygen and silane ($SiH_4$) to produce silicon-rich oxynitride ($Si_xO_yN_zH$). However, under different processing conditions, silicon oxide ($Si_xO_y$), a different type of seasoning material, is produced. TABLE 1 compares these two seasoning materials:

TABLE 1

| Comparison Items | $Si_xO_yN_zH$ | $Si_xO_y$ |
|---|---|---|
| Gas flow ratio of $N_2O/SiH_4$ | 2.3:1 | 20:1 |
| Deposition Rate (Å/min) | 2000 | 10000 |
| Refractive Index | 2.1 | 1.46 |
| Film Stress (Mpa) | −100 | −100 |
| Film compositions: Si:O:N:H (atm %, RBS) | 47:17:20:16 | 32:60:4:3 |

Refractive indexes of 1.46 for the $Si_xO_y$ layer and 2.1 for the $Si_xO_yN_zH$ layer were measured on bare silicon wafers using a Nanometrics 8300XSE instrument.

Silicon rich oxynitride films have a defective atomic lattice structure which is prone to further reaction with excess silicon atoms, or which may incorporate impurities. However, the PECVD $SiO_2$ film shown above in TABLE 1 and used for seasoning is close to an ideal stoichiometry of 1:2 silicon to oxygen ratio, so that this oxide film is stable in an amorphous structure of $SiO_4$ tetrahedra with an empirical formula $SiO_2$. Thus, oxide films with a refractive index of 1.46 have a more stable stoichiometric structure than silicon rich oxynitride films. This stable stoichiometric structure can contribute to the trapping of unstable species or to the passivation of internal chamber surfaces.

Deposited oxide seasoning films exhibit uniform thickness, composition, low particulates, good adhesion to the substrate and low stress to prevent cracking or lifting. Reduction in particle contamination on the wafer back side is also observed when the pre-CVD seasoning reaction is performed utilizing oxide.

Figure 4:
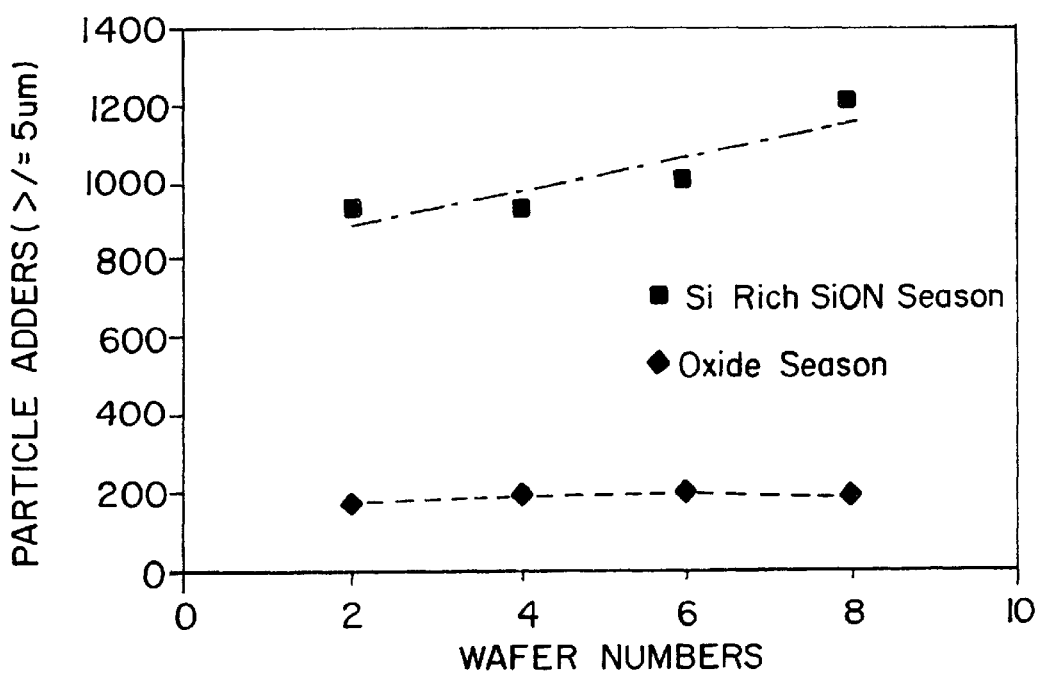
FIG. 4 plots wafer back side particle contamination versus wafer number for an oxide chamber seasoning step in accordance with one embodiment of the present invention.

FIG. 4 plots wafer back side contamination (quantified in units of particle adders) for pairs of wafers subjected to CVD utilizing the conventional wafer heating device, wherein one of the CVD chambers was exposed to a conventional $Si_xO_yN_zH$ seasoning prior to deposition, and the other CVD chamber was exposed to high quality oxide seasoning prior to deposition in accordance with one embodiment of the present invention. As shown in FIG. 4, the average amount of back side contamination of wafers processed in the oxide-seasoned CVD chamber was one-quarter the amount of back side wafer contamination for wafers processed in the $Si_xO_yN_zH$-seasoned CVD chamber.

High quality oxide seasoning layers in accordance with embodiments of the present invention may be formed where the $N_2O:SiH_4$ flow ratio is greater than 10:1, and preferably between 10:1 and 30:1.

B. Wafer Pre-Heating

Figure 2A:
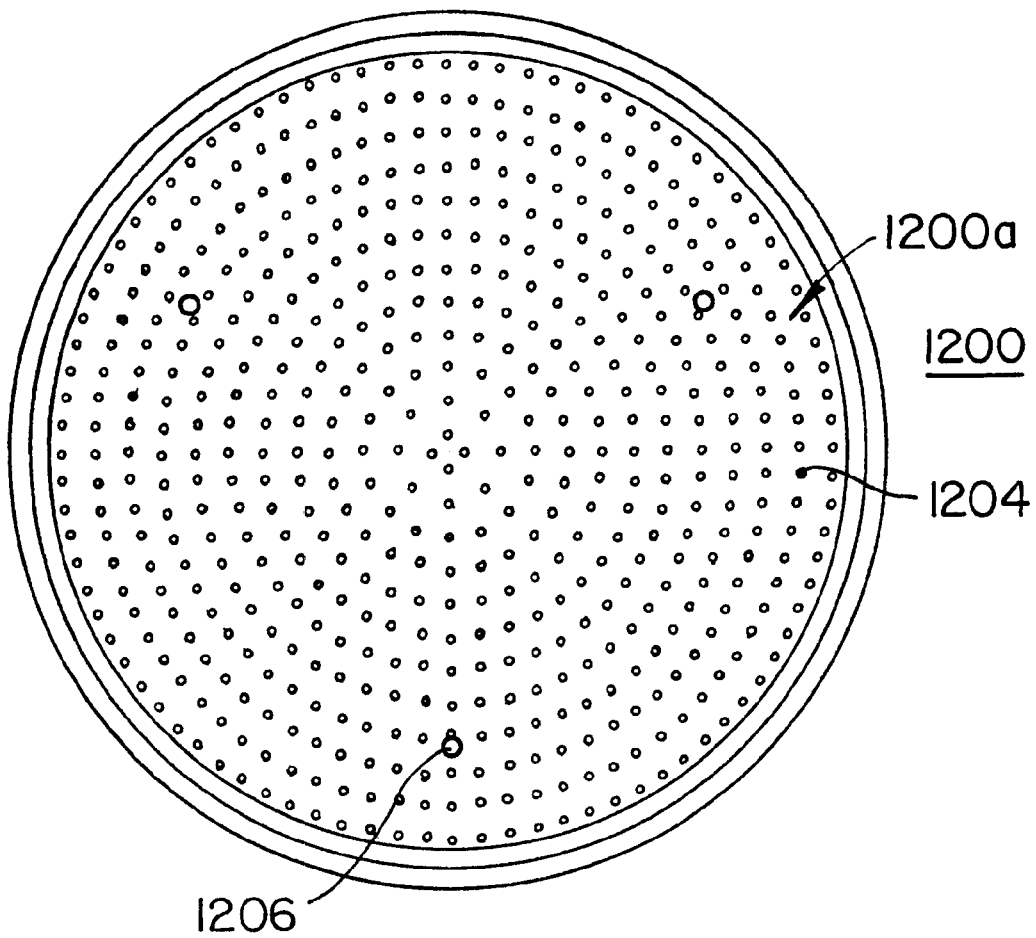
FIG. 2A shows a plan view of a conventional wafer heater structure.
Figure 2B:
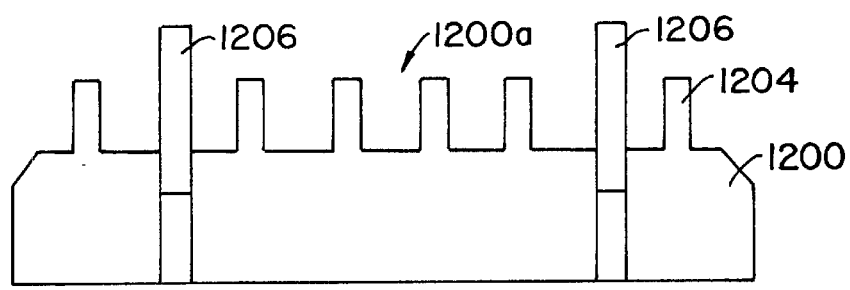
FIGS. 2B–2D show cross-sectional views of a method of wafer preheating in accordance with one embodiment of the present invention.

FIG. 2A shows a plan view, and FIG. 2B a cross-sectional view, of a conventional wafer heater positioned within a deposition chamber. Wafer heater 1200 includes a top surface 1202 featuring evenly-distributed projections 1204. Wafer heater 1200 also includes moveable lift pins 1206, shown in FIG. 2B as extended from the surface of wafer heater 1200.

Figure 2C:
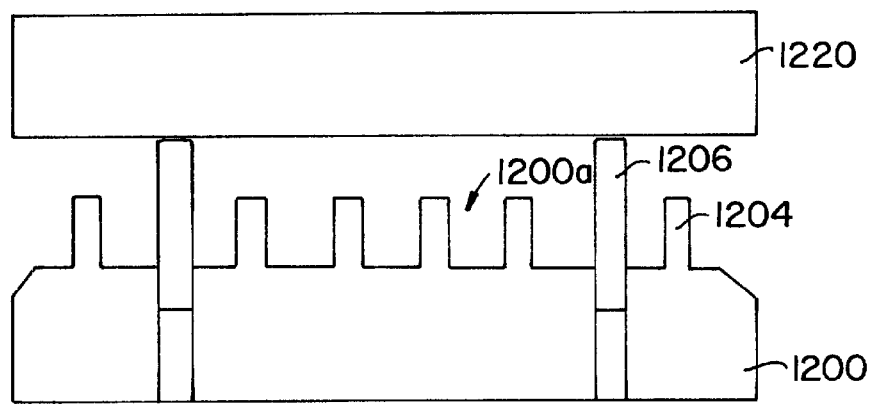

FIG. 2C shows a cross-sectional view of the introduction of semiconductor wafer 1220 into the deposition processing chamber. The thickness of the semiconductor wafer is exaggerated for purposes of illustration. Semiconductor wafer 1220 is generally substantially round in shape, with a short flat edge utilized in wafer orientation and alignment.

Figure 2D:
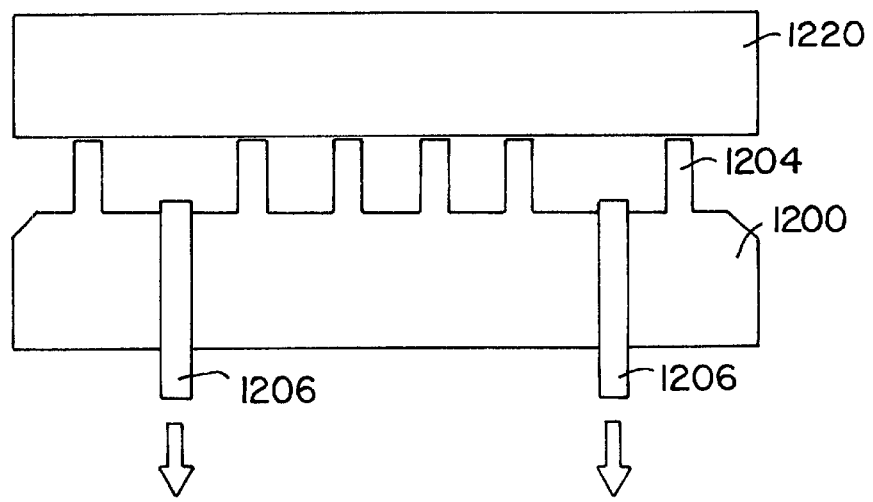

During the step shown in FIG. 2C, semiconductor wafer or substrate 1220 is placed onto lift pins 1206. Immediately after receiving wafer 1220, FIG. 2D shows that lift pins 1206 retract downward into surface 1202 of wafer heater 1200, and wafer 1220 is thereby lowered such that wafer back side 1223 comes into contact with projections 1204.

At this point in the process, wafer heater 1200 is at an elevated temperature suitable for a CVD reaction, for example at 400° C. Incoming wafer 1220, however, is typically at room temperature, 25° C. When room-temperature wafer 1220 is placed on the hot surface of wafer heater 1200, wafer 1220 can become thermally stressed due to the temperature gradient across the wafer, with the wafer becoming physically distorted from the planar until it reaches thermal equilibrium.

In order to minimize thermal stress and warpage of the wafer which can result from this temperature differential between inserted wafer and the wafer heater, one embodiment of the present invention pre-heats the wafer prior to its being placed into contact with the heater. One way of accomplishing such pre-heating is to delay retraction of the lift pins into the wafer heater surface for a short period, for example between about 5 and 30 seconds. This delayed retraction of the lift pins results in the wafer being heated by convection prior to being placed into direct contact with the wafer heater. Pre-heating of the wafer before it physically contacts the wafer heater minimizes the physical stress imposed on wafer, and, as shown below, also serves to reduce the resulting particulate contamination on the back side of the wafer.

TABLE 2 shows wafer backside contamination for six wafers subjected to CVD conditions utilizing a conventional wafer heater design and seasoning reaction, in which some of the wafers were pre-heated by delaying by 5 seconds lowering of the water into contact with the heater.

TABLE 2

| Wafer No. | Condition | Pre-Header Contact Back Side Wafer Contamination (Adders) | Post-Heater Contact Back Side Wafer Contamination (Adders) | Change in Back Side Wafer Contamination After Heater (Adders) |
|---|---|---|---|---|
| 1 | Wafer Pre-heating | 0 | 41 | +41 |
| 2 | No Wafer Pre-heating | 4 | 74 | +70 |
| 3 | Wafer Pre-heating | 7 | 26 | +19 |
| 4 | Wafer Pre-heating | 2 | 24 | +22 |
| 5 | No Wafer Pre-heating | 4 | 54 | +50 |
| 6 | No wafer Pre-heating | 3 | 155 | +152 |

TABLE 2 thus reveals that pre-heated wafers exhibit substantially reduced back side wafer contamination.

Figure 3:
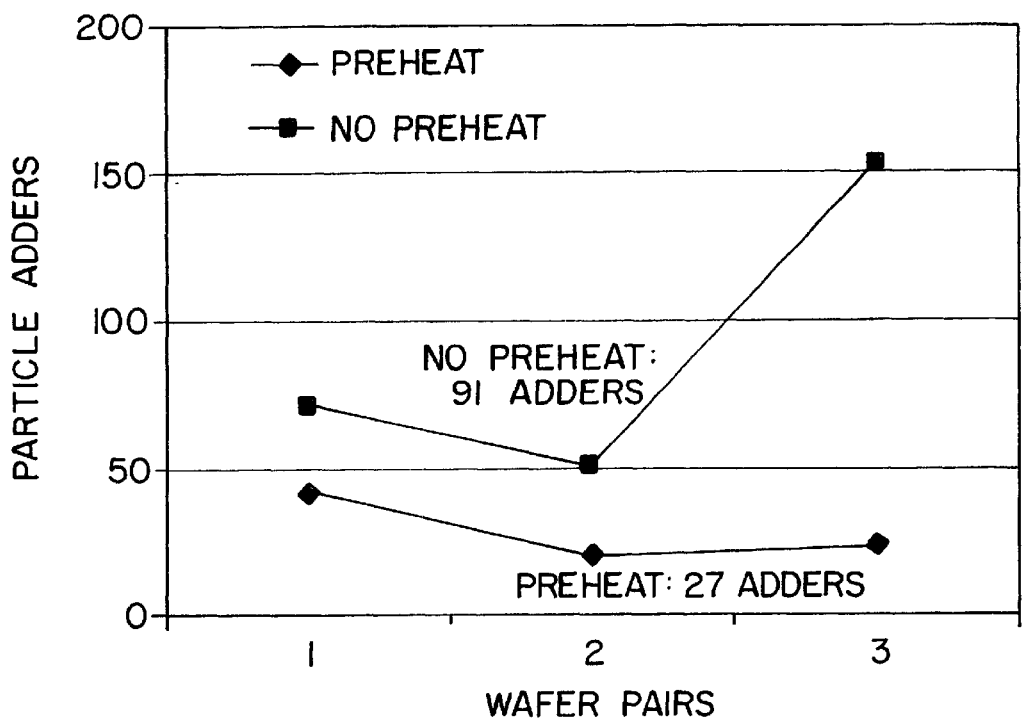
FIG. 3 plots backside particle contamination for three sets of wafers, with one wafer from each pair subjected to wafer preheating.

This result is confirmed by FIG. 3, which plots wafer backside contamination for three pairs of wafers subjected to CVD conditions utilizing a conventional wafer heating device during a conventional pre-deposition seasoning reaction. One wafer of each pair was subjected to pre-heating for a period of x seconds prior to retraction of the lift pins and lowering of the wafer into physical contact with the wafer heater, whereas the other wafer of the pair was immediately placed into contact with the heater. Observation of the shape of the heated wafers through transparent windows in the deposition chamber revealed significant reduction in wafer stress. Moreover, as shown in FIG. 3 the average amount of backside wafer contamination for the preheated wafers was one-third the amount of backside wafer contamination for the non-preheated wafers.

C. Stabilization of Flowed Process Gases

A typical PECVD process recipe includes the steps of, (1) stabilization of gas flows and pressure within the chamber, (2) deposition of solid material utilizing RF power, and (3) pumping remaining species out of the chamber. The flow of reactive gases during gas stabilization step (1) and prior to actual PECVD reaction can also contribute to backside particle contamination.

For example, the gas flow stabilization step of one conventional deposition process includes the flow of inert process gases (such as He or $N_2$) for 40 seconds simultaneous with the addition of reactive gases (such as $SiH_4$, $PH_3$, and $B_2H_6$) over a wafer surface heated to 400° C. While the inert process gases remain unreactive, the thermally reactive process gases may be thermally decomposed at the hot surface and react with unstable species such as fluorinated molecular fragments, oxidizers and hydrides to form unstable materials due to a lack of reaction energy in the stabilization steps. The unstable materials do not adhere well to surfaces and can be transferred to the backside of the wafer from the heater surface.

Figure 5:
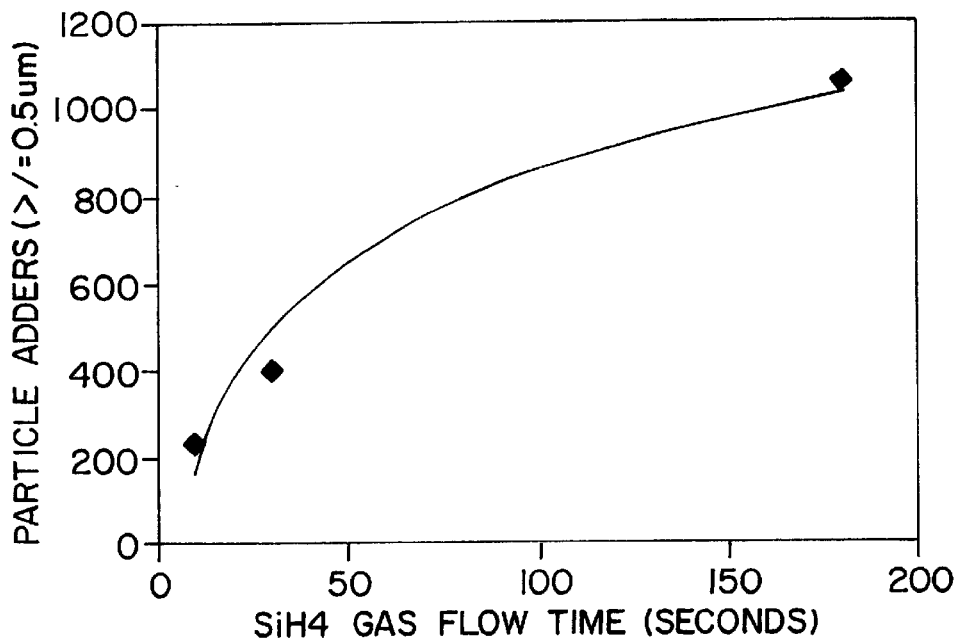
FIG. 5 plots backside wafer contamination versus $SiH_4$ process gas flow time.

FIG. 5 plots backside wafer contamination versus time of stabilization flow of thermally reactive $SiH_4$ process gas. FIG. 5 shows that backside particle numbers increased as a function of gas flow time. By reducing the flow time of inert gas to only 30 seconds, with the introduction of thermally reactive gases for only the last 10 seconds of this time period, the number of backside particles may be reduced over 30%.

D. Minimum Contact Wafer Heater Design

It has been discovered that the amount of wafer backside particle contamination is proportional to the area of the wafer backside in contact with the heater surface. Accordingly, one embodiment of the present invention utilizes a wafer heater design which minimizes the amount of contact between the wafer heater and the wafer.

As previously shown, FIG. 2A shows a illustrates a plan view, and FIG. 2B a cross-sectional view, of a conventional wafer heater design. Heater 1200 includes a top surface 1200a and a plurality of moveable lift pins 1206 extendable from surface 1200a of wafer heater 1200. Wafer heater 1200 has a diameter of 300 mm and features five hundred and thirty-two evenly-distributed projections 1204 that occupy approximately 2% of the back side surface area of a wafer placed thereupon.

Figure 6A:
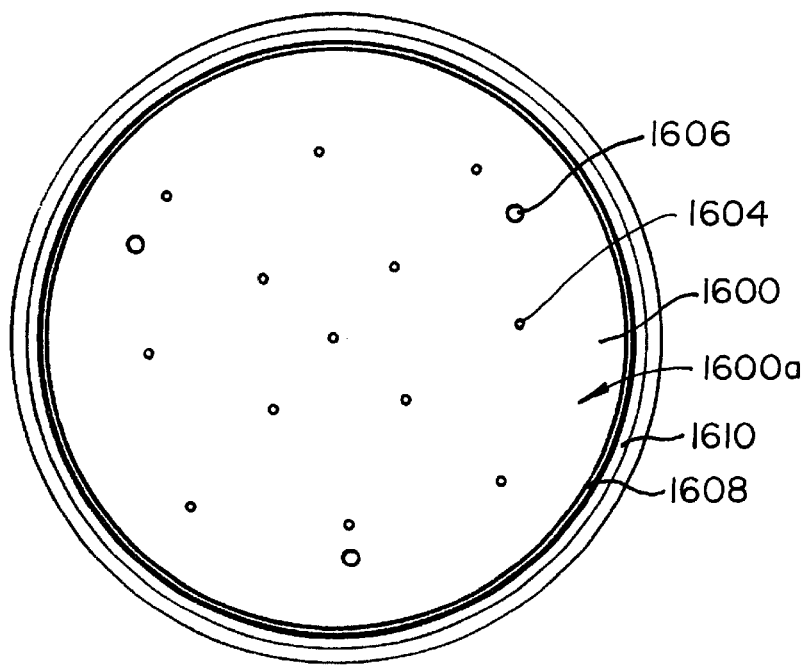
FIG. 6A shows a plan view of a minimum contact wafer heater structure in accordance with one embodiment of the present invention.
Figure 6B:
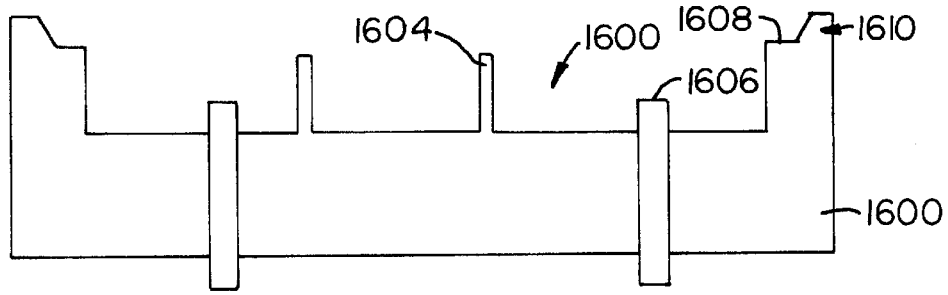
FIGS. 6B–6E show cross-sectional views of method steps for performing deposition on a wafer supported by a minimum contact wafer heater in accordance with one embodiment of the present invention.

By contrast, FIG. 6A shows a plan view, and FIG. 6B a cross-sectional view, of one embodiment of a minimum contact heater design in accordance with the present invention. Minimum contact heater 1600 includes a top surface 1600a featuring a plurality of moveable lift pins 1606 extendable from surface 1600a of wafer heater 1600. Wafer heater 1600 further includes a continuous circumferential rim 608 having a width of 3 mm. Rim 1608 is in turn surrounded by an inclined ridge 1610. Minimum contact heater 1600 has a diameter of 300 mm and features only thirteen evenly-distributed projections 1604 that, excluding the wafer edge in contact with rim 1608, occupy approximately 0.1% of the back side surface area of a wafer placed thereupon.

Figure 6C:
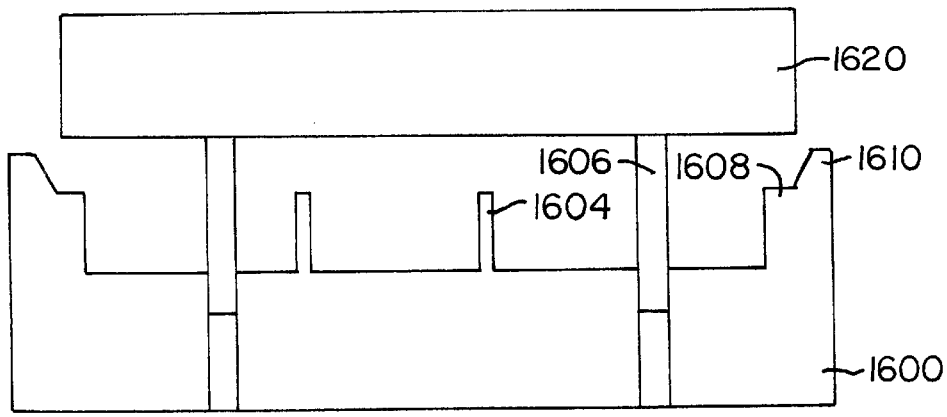

FIG. 6C shows the placement of wafer 1620 onto extended lift pins 1606. The thickness of the semiconductor wafer is exaggerated for purposes of illustration. Semiconductor wafer 1620 is generally substantially round in shape, with a short flat edge utilized in wafer orientation and alignment.

Figure 6D:
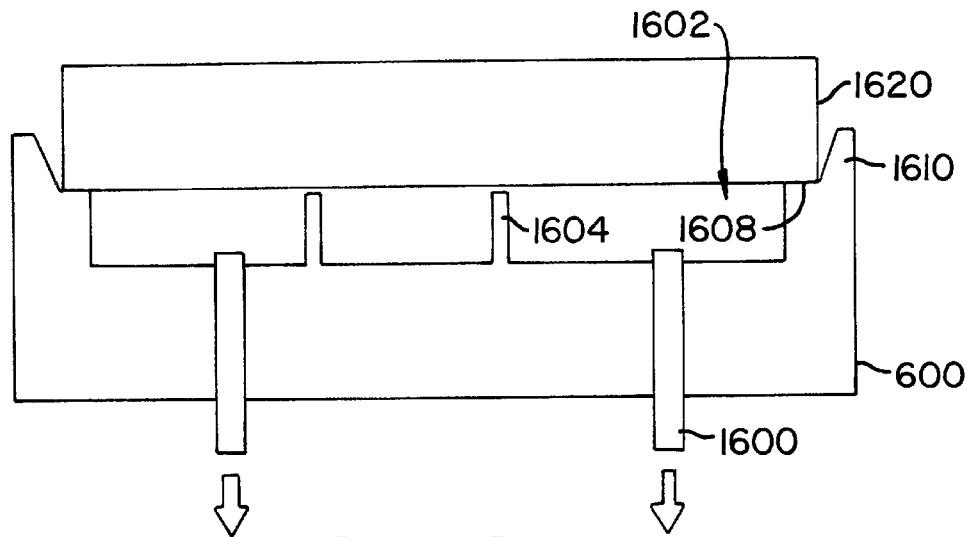

FIG. 6D shows retraction of lift pins 1606 into wafer heater surface 1600a such that wafer 1620 is lowered onto upper surface 1600a of heater 1600. During this step, rim 1608 and inclined ridge 1610 form a self-aligned pocket 1612, into which lowered wafer 1620 becomes seated such that a seal is formed between rim 1608 and peripheral edge regions of wafer 1620.

Figure 6E:
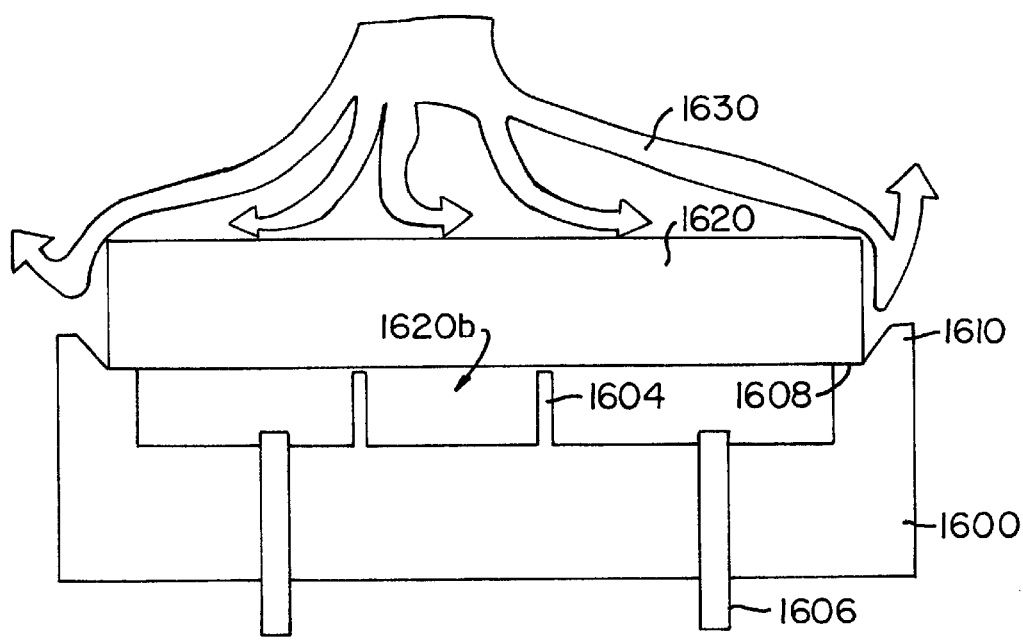

FIG. 6E shows a chemical vapor deposition method step in accordance with the first embodiment of the present invention. During this step, stabilized process gases 1630 are flowed over wafer 1620 and exposed to plasma. As a result, wafer 1620 becomes coated with deposited material. Also during this step, rim 1608 interferes with process gases 1630 from coming into contact with backside surface 1620b of wafer 1620.

Upon completion of the CVD reaction shown in FIG. 6E, the lift pins extend upward from surface of the wafer heater and raise coated wafer off of the heater. The elevated wafer is then engaged and transported to the next step in the fabrication process flow.

Use of a wafer heater design in accordance with one embodiment of the present invention offers the advantage of significantly reducing backside wafer contamination as compared with conventional wafer heaters. This is evidenced by the experimental results shown in TABLE 3 and TABLE 4, and also in FIGS. 7, 8, and 9, which compare backside contamination of wafers subjected to CVD while being heated by different heater designs.

TABLE 3 compares wafer backside contamination resulting from a conventional flat wafer heater lacking projections from the top surface, a conventional wafer heater bearing projections from its top surface, and one embodiment of a minimum contact heater design in accordance with the present invention.

TABLE 3

| Heater Design Feature | Conventional Flat Heater w/o Projections | Conventional Heater w/Projections | Minimum Contact Heater |
|---|---|---|---|
| Number of Projections | 0 | 532 | 13 |
| Size of Projections (mils) | 0 | 100 | 50 |
| Height of Projections (mils) | 0 | 0.4 | 0.4 |
| Width of Edge rim (mm) | no rim | no rim | 3 |
| Backside Particle adders (>/=5 μm) | 3000~5000 | 500~200 | <100 |
| % of Wafer Backside in Contact with Heater (excluding wafer rim) | 100% | ~2% | <0.1% |

TABLE 3 shows that wafers processed utilizing the conventional flat heater exhibited significant back side particle contamination (3000~5000 adders), with substantial wafer-to-wafer variation. Wafers processed utilizing the conventional heater featuring projections consistently exhibited backside contamination of 500~2000 adders.

By contrast, wafers processed utilizing the minimum contact heater design shown in FIGS. 6A and 6B exhibited backside particle contamination of less than 100 adders. With this minimum contact heater design, the surface area of the heater in physical contact with the backside of the wafer was reduced to less than 0.1% of 300 mm wafer area (excluding the 3 mm region at the wafer edge supported by the circumferential rim). This was accomplished by reducing the number of projections from 532 to 13, and by reducing the diameter of the projections to 50 mils from 100 mils.

Additional experiments were conducted to determine sources of backside particle contamination utilizing Applied Materials' 300 mm Producer™ PECVD Twin chamber system configured with side-by-side single wafer processing stations sharing seasoning gases, processing gases and vacuum. Wafers were processed upside down for wafer backside particle test, and the amount of particle contamination measured with Tencor-KLA SP1-TBI instrument.

Figure 7:
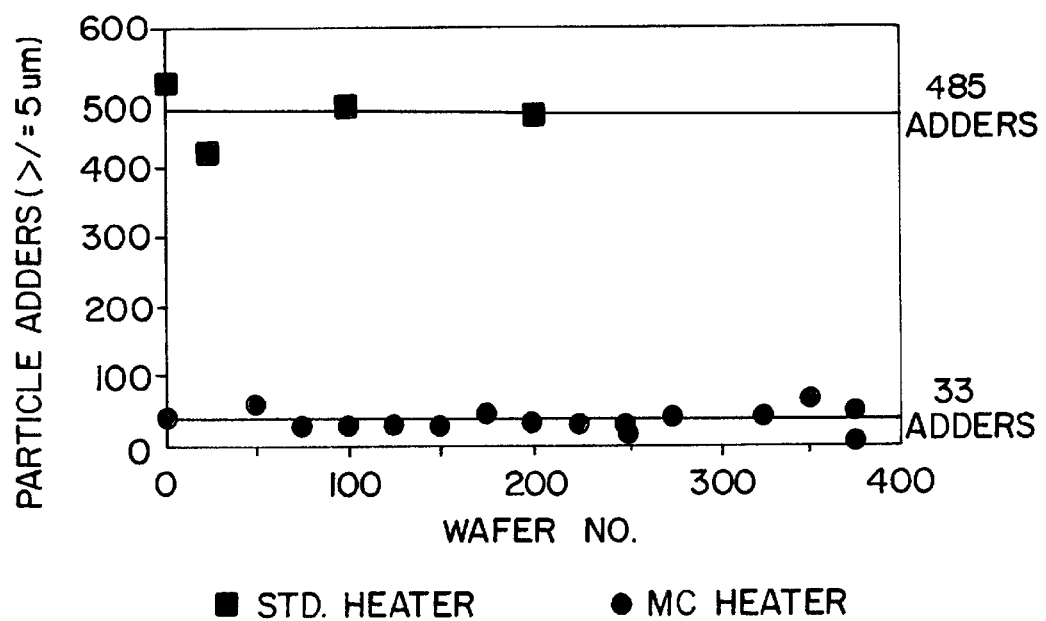
FIG. 7 plots backside particle contamination versus wafer number for three sets of wafers having material deposited utilizing a conventional heater structure and material deposited utilizing a minimum contact heater structure in accordance with one embodiment of the present invention.

FIG. 7 plots backside wafer contamination for an ARC deposition processing step performed using the conventional wafer heater of FIG. 2A versus a minimum contact wafer heater in accordance with one embodiment of the present invention as shown in FIGS. 6A and 6B. Wafers processed utilizing a minimum contact wafer heater exhibited an average contamination of 33 adders, while wafers processed utilizing a conventional heater design with projections exhibited an average contamination of 485 adders.

Figure 8:
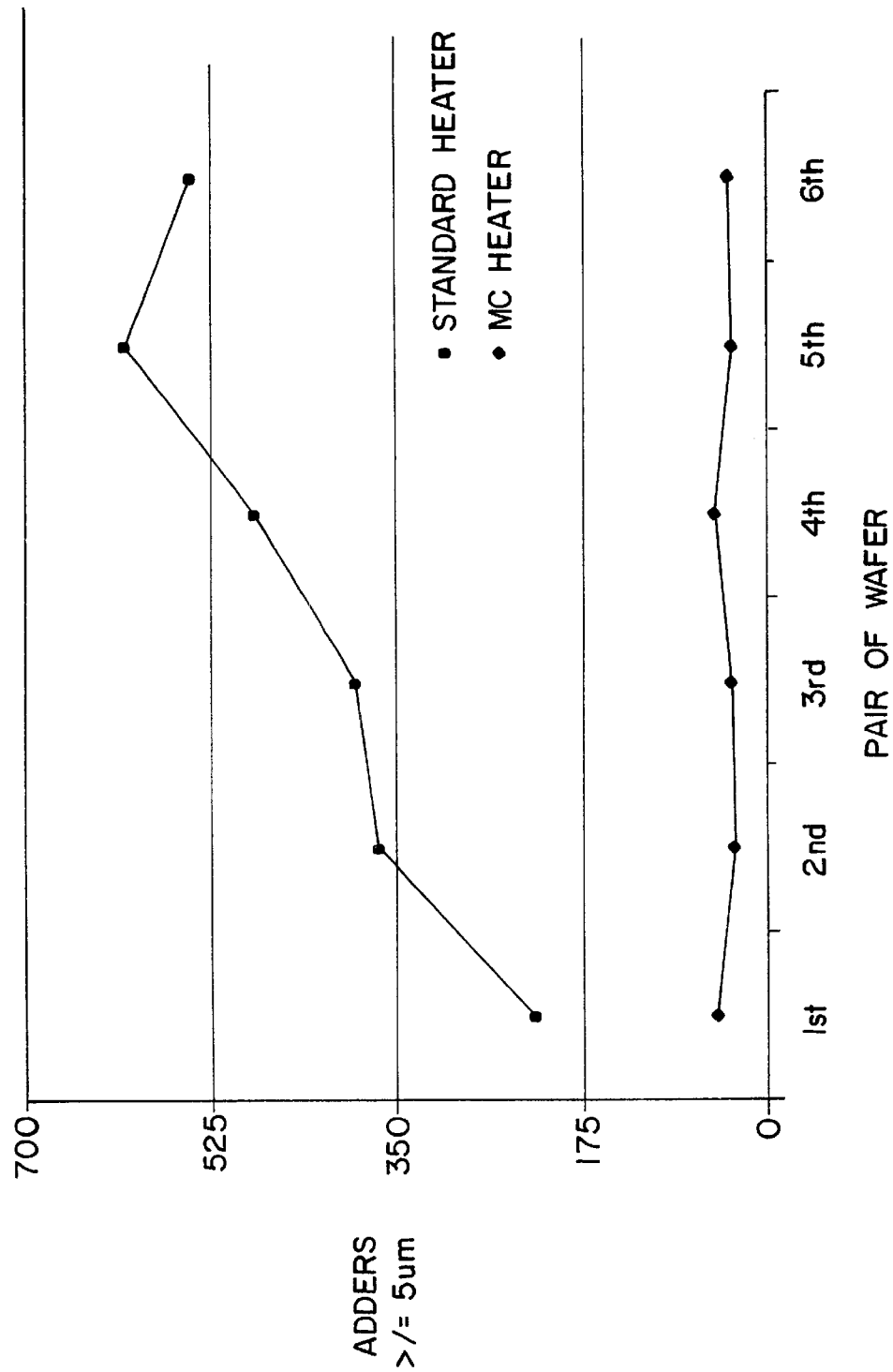
FIG. 8 plots backside wafer contamination versus wafer number for six sets of wafers having material deposited utilizing a conventional heater structure and material deposited utilizing a minimum contact heater in accordance with one embodiment of the present invention.

These results were confirmed by additional experimentation as shown in FIG. 8. FIG. 8 plots wafer back side particle contamination versus wafer pair number for six pairs of wafers, in which one wafer was processed utilizing a conventional heater design and the other wafer was processed utilizing one embodiment of a minimum contact heater in accordance with the present invention.

Backside particle contamination results of FIG. 8 are also shown in TABLE 4 below:

TABLE 4

| Wafer Pair No. | Wafer No. | FIG. No showing metrology of wafer contamination. | Wafer Heater Design | Post-CVD Back Side Wafer Contamination (Adders) | Relation to Prior CVD Chamber Clean Step |
|---|---|---|---|---|---|
| 1 | 1 | 9A | Conventional w/ Projections | 219 | First wafer after chamber clean |
| 1 | 2 | 9B | Minimum Contact | 48 | First wafer after chamber clean |
| 2 | 1 | not shown | Conventional w/ Projections | 365 | Second wafer after chamber clean |
| 2 | 2 | not shown | Minimum Contact | 30 | Second wafer after chamber clean |
| 3 | 1 | 9C | Conventional w/ Projections | 388 | Third wafer after chamber clean |
| 3 | 2 | 9D | Minimum Contact | 33 | Third wafer after chamber clean |
| 4 | 1 | not shown | Conventional w/ Projections | 484 | Fourth wafer after chamber clean |
| 4 | 2 | not shown | Minimum Contact | 50 | Fourth wafer after chamber clean |
| 5 | 1 | not shown | Conventional w/ Projections | 607 | Fifth wafer after chamber clean |
| 5 | 2 | not shown | Minimum Contact | 33 | Fifth wafer after chamber clean |
| 6 | 1 | 9E | Conventional w/ Projections | 544 | Sixth wafer after chamber clean |
| 6 | 2 | 9F | Minimum Contact | 37 | Sixth wafer after chamber clean |

Figure 9A:
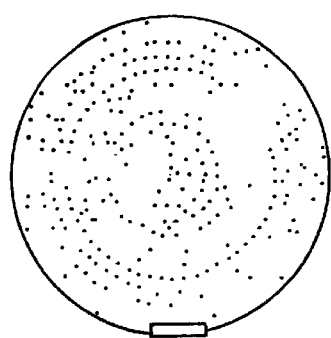
FIGS. 9A–9F show tomography results for three sets of wafer pairs heated utilizing the conventional heater structure or a minimum contact heater in accordance with one embodiment of the present invention.
Figure 9B:
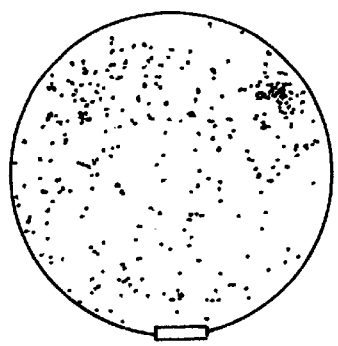
Figure 9C:
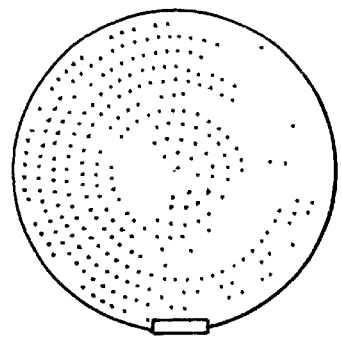
Figure 9D:
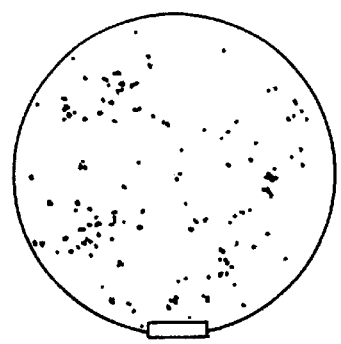
Figure 9E:
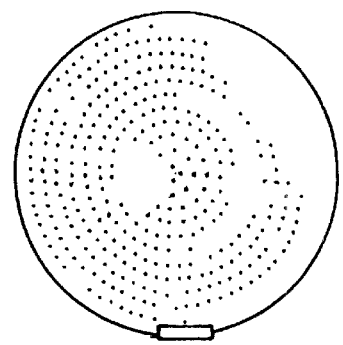
Figure 9F:
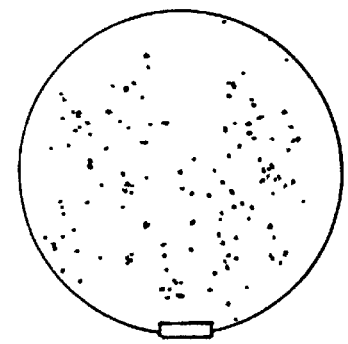

FIGS. 9A–9F show metrology results for the first, third and sixth wafer pairs of FIG. 8. Comparison of FIGS. 9A, 9C, and 9E with prior FIG. 2A shows the pattern of back side wafer particle contamination to mirror the number and position of projections of the conventional wafer heater structure. By contrast, FIGS. 9B, 9D, and 9F show that use of the minimum-contact wafer heater structure in accordance with one embodiment of the present invention resulted in a substantial reduction in wafer backside particle contamination. Moreover, the location of this contamination seemed to be random and did not appear to correspond to the position of wafer heater projections.

In summary, utilizing the techniques of the present invention, particle contamination of the backside of semiconductor wafers was reduced to below 100 adders, >/=5 $\mu$m. This was accomplished by 1) changing the chamber seasoning material layer from conventional silicon-rich oxynitride to a high quality silicon oxide, 2) preheating the wafers prior to contacting them with the wafer heater in order to reduce thermal stress, 3) minimizing the flow time of thermally reactive gases into the chamber during stabilization, and 4) changing the design of the wafer heater to minimize physical contact with the wafer backside and to prevent exposure of the wafer backside to deposition gases. It should be recognized that the above-referenced techniques may be employed alone or in combination in order to reduce wafer back side contamination.

The above-described experimental results were obtained utilizing a Applied Materials Producer™ system outfitted for 300 mm wafers. As a person of ordinary skill in the art would understand, the techniques for minimizing wafer backside contamination just described are not limited to this particular apparatus, and could be employed to minimize back side wafer contamination in other CVD systems.

The above description is illustrative and not restrictive, and as such the process parameters listed above should not be limiting to the claims as described herein. For example, while the invention is illustrated above with particular reference to one embodiment of a minimum contact wafer heater having the specified number and size of projections from its top surface, one of ordinary skill in the art would recognize that the present invention is not limited to this particular structure. It is possible to use other shapes and configurations of minimum contact heater designs in order to achieve similar results.

It is also possible to employ the above-described techniques for minimizing wafer back side contamination methods on other semiconductor processing systems requiring control over backside particle contamination, including but not limited to metrology tools, high density plasma chemical vapor deposition (HDP CVD) systems, sub-atmospheric chemical vapor deposition (SACVD) systems, high temperature chemical vapor deposition (HTCVD) systems, and furnaces employed to bake photoresist-coated wafers.

The scope of the invention should therefore be determined with reference to the above description and to the appended claims, along with their full scope of equivalents.

What is claimed is:

1. An apparatus comprising:
   a pedestal including a heated top surface;
   a plurality of projections extending upward from the top surface; and
   an elevated rim positioned around a circumference of the top surface, the rim creating a seal with a peripheral edge of a back side of a wafer seated upon the projections, the seal interfering with a flow of process gases to the back side of the wafer.

2. The apparatus of claim 1 further comprising a lift pin moveable from an extended position above the top surface to a retracted position within the pedestal.

3. The apparatus of claim 1 wherein a diameter of the top surface is approximately 300 mm and a number of points of contact between the projections and a back side of a wafer seated on the projections is twenty or less.

4. The apparatus of claim 1 wherein the projections occupy a surface area of 1% or less of a back side of a wafer seated upon the projections.

5. The apparatus of claim 1 further comprising an inclined ridge surrounding the rim, the ridge seating a back side of a wafer lowered by the lift pin onto the projections and the rim.

6. The apparatus of claim 1 further comprising a high quality silicon oxide coating formed over the circular top surface by a flow of nitrogen-containing gas in combination with a flow of silicon-containing gas, such that a flow ratio of the nitrogen containing gas to the silicon-containing gas is greater than 10:1.

* * * * *